US011855648B2

(12) United States Patent
Malhotra

(10) Patent No.: US 11,855,648 B2
(45) Date of Patent: Dec. 26, 2023

(54) CLOCK PATTERN DETECTION AND CORRECTION

(71) Applicant: Samsung Display Co., Ltd., Yongin-si (KR)

(72) Inventor: Gaurav Malhotra, Cupertino, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/720,671

(22) Filed: Apr. 14, 2022

(65) Prior Publication Data

US 2023/0231561 A1    Jul. 20, 2023

Related U.S. Application Data

(60) Provisional application No. 63/299,467, filed on Jan. 14, 2022.

(51) Int. Cl.
| | | |
|---|---|---|
| *H03D 3/24* | (2006.01) | |
| *H03L 7/08* | (2006.01) | |
| *G06F 9/448* | (2018.01) | |
| *H04L 7/033* | (2006.01) | |

(52) U.S. Cl.
CPC .......... *H03L 7/0807* (2013.01); *G06F 9/4498* (2018.02); *H04L 7/0331* (2013.01)

(58) Field of Classification Search
CPC ... H03L 7/0807; G06F 9/4498; H04L 7/0331; H04L 25/03057
USPC ................ 375/343, 342, 373, 375, 376, 326
See application file for complete search history.

(56) References Cited

U.S. PATENT DOCUMENTS

| | | | |
|---|---|---|---|
| 5,761,212 A | 6/1998 | Foland, Jr. et al. | |
| 8,351,559 B1 | 1/2013 | Thomas | |
| 8,923,380 B1 * | 12/2014 | Malhotra | .......... H04L 25/03057 |
| | | | 375/232 |
| 10,536,259 B1 | 1/2020 | Kenyon | |
| 10,804,913 B1 | 10/2020 | Talegaonkar et al. | |
| 2010/0215134 A1 | 8/2010 | Sato | |
| 2010/0329323 A1 | 12/2010 | Hsu | |
| 2013/0287154 A1 | 10/2013 | Tomita | |
| 2014/0126656 A1 | 5/2014 | Chung et al. | |
| 2016/0013929 A1 | 1/2016 | Takanashi et al. | |
| 2019/0130942 A1 | 5/2019 | Hormati et al. | |

FOREIGN PATENT DOCUMENTS

WO     2018/130311 A1     7/2018

OTHER PUBLICATIONS

European Search Report for EP Application No. 23151767.3 dated Jun. 15, 2023, 8 pages.
Lim, H. et al. "Low-Complexity Receiver Algorithms for the Grand-Alliance VSB HDTV System," IEEE Transactions on Consumer Electronics, 72(3), Aug. 1996, pp. 640-650.

* cited by examiner

*Primary Examiner* — Phuong Phu
(74) *Attorney, Agent, or Firm* — Lewis Roca Rothgerber Christie LLP

(57) ABSTRACT

A clock and data recovery (CDR) system includes a correlator configured to receive data, determine a first value of the received data, and output a second value corresponding to the received data, an accumulator configured to generate an accumulation value by accumulating the second value output from the correlator and output the accumulation value, and a state machine configured to determine whether a repeating pattern is present in the CDR system based on the accumulation value.

20 Claims, 15 Drawing Sheets

CLOCK PATTERN DETECTION AND CORRECTION

CROSS-REFERENCE TO RELATED APPLICATION(S)

This application is based on and claims priority under 35 U.S.C. § 119 to U.S. Provisional Application No. 63/299,467, filed on Jan. 14, 2022, the disclosure of which is incorporated herein by reference in its entirety.

BACKGROUND

1. Field

The disclosure relates generally to a method, system and device for clock pattern detection and correction, and, in particular, for timing recovery for high speed serial links.

2. Description of Related Art

In high speed serial links, a repeating 1010 pattern may occur. Such a clock pattern creates an issue for baud rate (i.e., symbol spaced) timing recovery. For example, a regular pseudorandom binary sequence (PRBS) may be transmitted and a 1010 pattern may appear in a data link. To continuously extract information, a clock data and recovery (CDR) system may need to determine whether to increase or decrease a frequency. However, there is no information to indicate whether to increase or decrease the frequency. That is, a receiver is continuously tracking the changes in the frequency of the transmitter by either increasing (UP) or decreasing (DOWN) its own frequency. This information whether to increase or decrease comes from the CDR phase detection logic. In the case of a 1010 pattern, the logic does not give any information to the CDR system, and the CDR system doesn't know whether to go UP or DOWN. Thus, the CDR system does not receive any new information (i.e., UP/DOWN). The previously performed update is then slightly off the true value and gets stuck in a memory, causing the CDR system to drift in a wrong direction until a random pattern is resumed.

SUMMARY

In accordance with an aspect of an example embodiment, a clock and data recovery (CDR) system may include a correlator configured to receive data, determine a first value of the received data, and output a second value corresponding to the received data, an accumulator configured to generate an accumulation value by accumulating the second value output from the correlator and output the accumulation value, and a state machine configured to determine whether a repeating pattern is present in the CDR system based on the accumulation value.

In accordance with an aspect of an example embodiment, a method of a CDR system may include receiving, by a correlator, data, determining, by the correlator, a first value of the received data, outputting, by the correlator, a second value corresponding to the received data, generating, by an accumulator, an accumulation value by accumulating the second value output from the correlator, outputting, by the accumulator, the accumulation value, determining, by a state machine, whether a repeating pattern is present in the CDR system based on the accumulation value.

In accordance with an aspect of an example embodiment, an electronic device may include a correlator that is configured to receive data, determine a first value of the received data, and outputs a second value corresponding to the received data, an accumulator that is configured to generate an accumulation value by accumulating the second value output from the correlator, and output the accumulation value, and a state machine that is configured to determine whether a repeating pattern is present based on the accumulation value.

Additional aspects will be set forth in part in the description that follows and, in part, will be apparent from the description, or may be learned by practice of the presented embodiments of the disclosure.

BRIEF DESCRIPTION OF THE DRAWINGS

The above and other aspects, features, and aspects of embodiments of the disclosure will be more apparent from the following description taken in conjunction with the accompanying drawings, in which.

DETAILED DESCRIPTION

The following detailed description of example embodiments refers to the accompanying drawings. The same reference numbers in different drawings may identify the same or similar elements.

Figure 1:
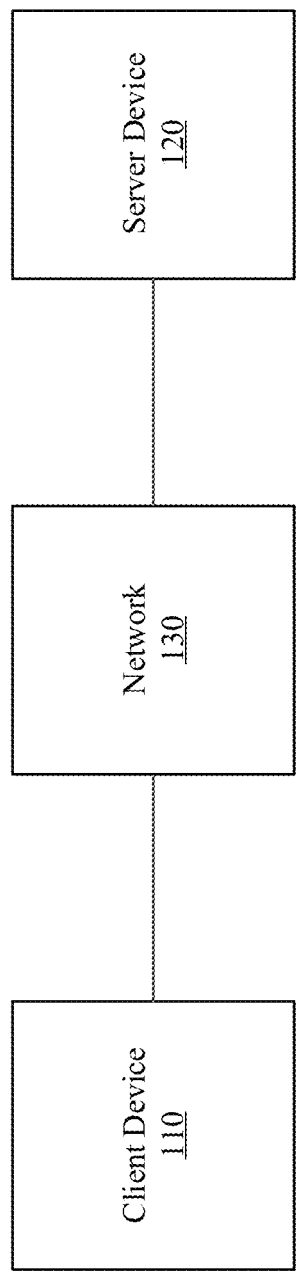
FIG. 1 is a diagram of devices of a system according to an embodiment.

FIG. 1 is a diagram of a system according to an embodiment. FIG. 1 includes a client device 110, a server device 120, and a network 130. The client device 110 and the server device 120 may interconnect via through the network 130 providing wired connections, wireless connections, or a combination of wired and wireless connections.

The client device 110 may include a computing device (e.g., a desktop computer, a laptop computer, a tablet computer, a handheld computer, a smart speaker, a server device, etc.), a mobile phone (e.g., a smart phone, a radiotelephone, etc.), a camera device, a wearable device (e.g., a pair of smart glasses or a smart watch), or a similar device, according to embodiments.

The server device 120 may include one or more devices. For example, the server device 120 may be a server device, a computing device, or the like which includes hardware such as processors and memories, software modules and a combination thereof to perform corresponding functions.

The network 130 may include one or more wired and/or wireless networks. For example, network 130 may include a cellular network (e.g., a fifth generation (5G) network, a long-term evolution (LTE) network, a third generation (3G) network, a code division multiple access (CDMA) network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, or the like, and/or a combination of these or other types of networks.

The number and arrangement of devices and networks shown in FIG. 1 are provided as an example. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) may perform one or more functions described as being performed by another set of devices.

Figure 2:
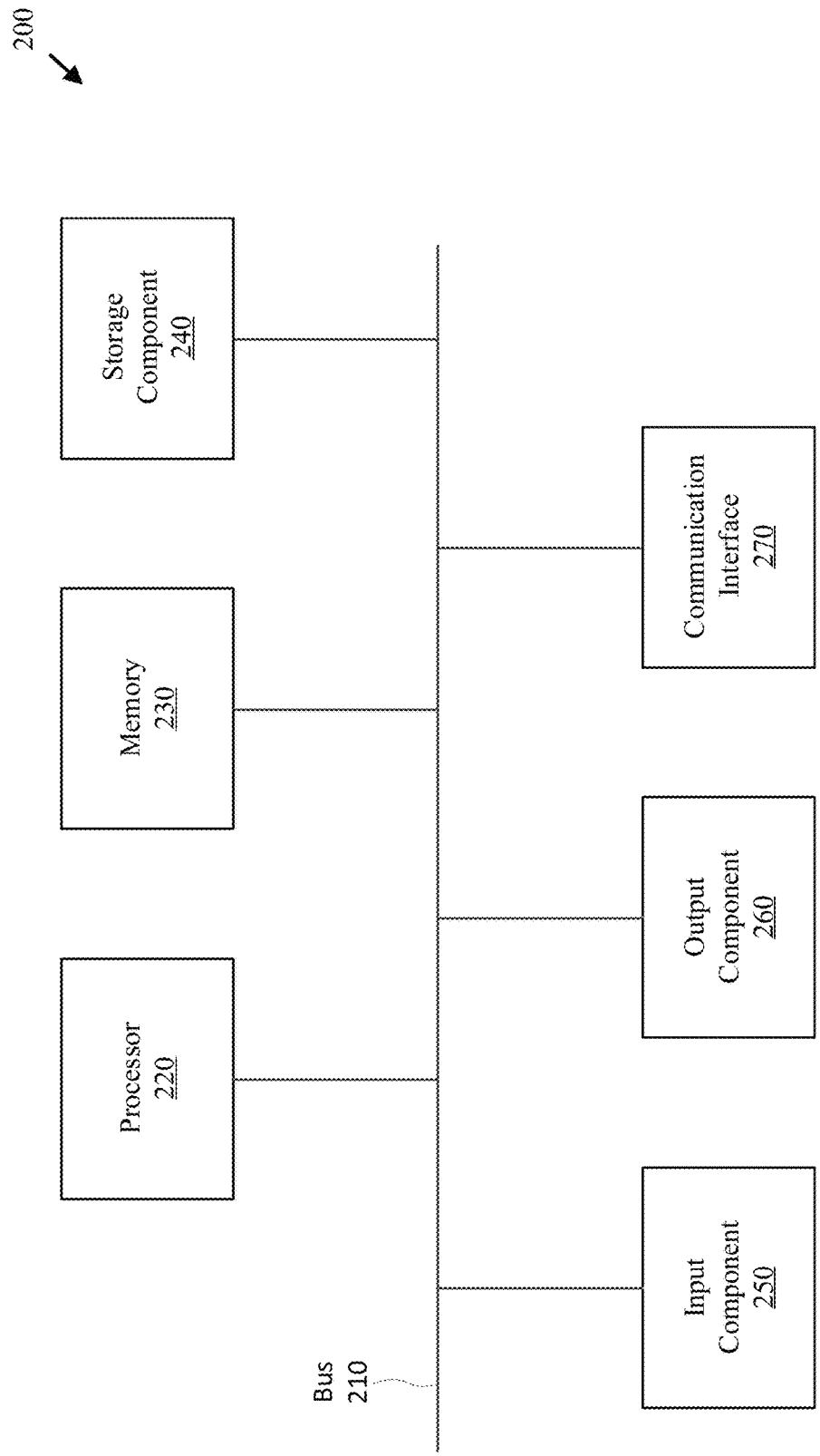
FIG. 2 is a diagram of components of the devices of FIG. 1 according to an embodiment.

FIG. 2 is a diagram of components of one or more devices of FIG. 1 according to an embodiment. Device 200 shown in FIG. 2 may correspond to the client device 110 and/or the server device 120.

As shown in FIG. 2, the device 200 may include a bus 210, a processor 220, a memory 230, a storage component 240, an input component 250, an output component 260, and a communication interface 270.

The bus 210 may include a component that permits communication among the components of the device 200. The processor 220 may be implemented in hardware, software, firmware, or a combination thereof. The processor 220 may be implemented by one or more of a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), and another type of processing component. The processor 220 may include one or more processors capable of being programmed to perform a corresponding function.

The memory 230 may include a random access memory (RAM), a read only memory (ROM), and/or another type of dynamic or static storage device (e.g., a flash memory, a magnetic memory, and/or an optical memory) that stores information and/or instructions for use by the processor 220.

The storage component 240 may store information and/or software related to the operation and use of the device 200. For example, the storage component 240 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

The input component 250 may include a component that permits the device 200 to receive information, such as via user input (e.g., a touch screen display, a keyboard, a keypad, a mouse, a button, a switch, and/or a microphone). The input component 250 may also include a sensor for sensing information (e.g., a global positioning system (GPS) component, an accelerometer, a gyroscope, and/or an actuator).

The output component 260 may include a component that provides output information from the device 200 (e.g., a display, a speaker, and/or one or more light-emitting diodes (LEDs)).

The communication interface 270 may include a transceiver-like component (e.g., a transceiver and/or a separate receiver and transmitter) that enables the device 200 to communicate with other devices, such as via a wired connection, a wireless connection, or a combination of wired and wireless connections. The communication interface 270 may permit device 200 to receive information from another device and/or provide information to another device. For example, the communication interface 270 may include an Ethernet interface, an optical interface, a coaxial interface, an infrared interface, a radio frequency (RF) interface, a universal serial bus (USB) interface, a Wi-Fi interface, a cellular network interface, or the like.

The device 200 may perform one or more processes described herein. The device 200 may perform operations based on the processor 220 executing software instructions stored in a non-transitory computer-readable medium, such as the memory 230 and/or the storage component 240. A computer-readable medium is defined herein as a non-transitory memory device. A memory device includes memory space within a single physical storage device or memory space spread across multiple physical storage devices.

Software instructions may be read into the memory 230 and/or the storage component 240 from another computer-readable medium or from another device via the communication interface 270. When executed, software instructions stored in the memory 230 and/or storage component 240 may cause the processor 220 to perform one or more processes described herein.

Additionally, or alternatively, hardwired circuitry may be used in place of or in combination with software instructions to perform one or more processes described herein. Thus, embodiments described herein are not limited to any specific combination of hardware circuitry and software.

Provided are a system, method and device that detect and correct a repeated 1010 pattern, according to an embodiment. As used herein, a "1010 pattern" may refer to a data pattern in a pseudorandom binary sequence (PRBS) where the bit pattern of "1010" is repeated. The systems, methods and devices according to embodiments may utilize a correlator that may include a single delay element and may be configured to detect a long string of a 1010 pattern. The correlator may be configured to receive the incoming pattern. Since the correlator may be configured to detect a 1010 pattern (i.e., the correlator may be configured to detect a particular pattern), the correlator may be implemented with a single delay line in the overall structure.

Based on detecting the 1010 pattern, the system, method and device in the present embodiment may correct for the effects of long periods of a 1010 clock pattern by supplying a running average of the history in a Kf register. The running average may be determined by a leaky integrator. The system, method and device may include a relief integrator, and a delay line which stores a previous value.

Figure 3:
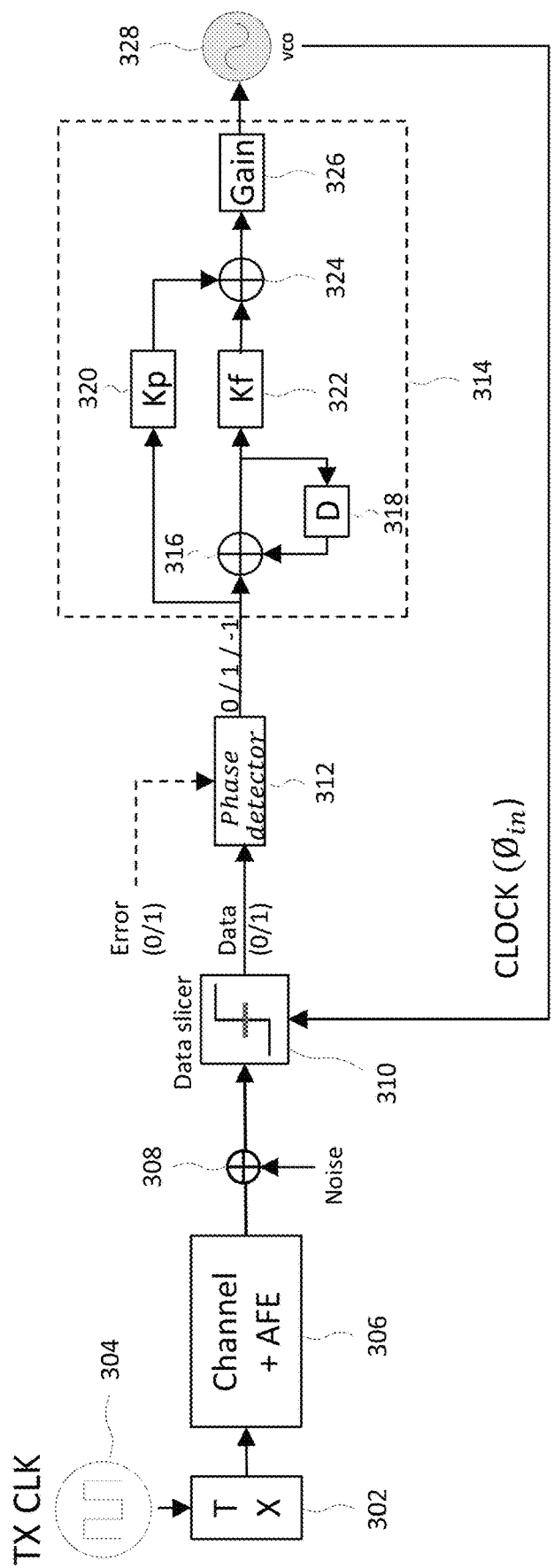
FIG. 3 is a diagram of a clock and data recovery (CDR) system, according to an embodiment.

FIG. 3 is a diagram of a clock and data recovery (CDR) system, according to an embodiment. The system may include a transmitter (TX) 302 configured to transmit data based on a TX clock (CLK) signal 304 to a channel plus analog front end (AFE) 306 (the CLK signal 304 may be recovered at a receiver implementing a CDR circuit based on the data that is based on the CLK signal 304). The output of the channel+AFE 306 may be accumulated with noise by an adder 308, and the output of the adder 308 may be sent to a data slicer 310. A phase detector 312 may receive the output of the data slicer 310. Further, based on the output of the phase detector 312 and an input error, the phase detector 312 may generate a signal that is output to a proportional-integral loop filter 314. The proportional-integral loop filter 314 may include an adder 316, a delay line 318, a Kp register 320, a Kf register 322, an adder 324, and a gain function 326. The signal output by the proportional-integral loop filter 314 may be sent to a voltage-controlled oscillator (VCO) 328. The signal from the VCO 328 (e.g., CLOCK ($\emptyset_{in}$)) may be looped back to the data slicer 310.

The adder 316 may accumulate the output of the delay line 318 which stores the previous value of the Kf register 322. The output of the phase detector 312 may be either 0, 1 or −1. When the data is a 1010 pattern, the output of the phase detector 312 is 0. In this case, the output of the Kp register 320 is 0, and the output of the Kf register 322 is not the true value. Therefore, the VCO 328 may drift. The delay line 318 may become stuck because it is storing the previous value of the Kf register 322, which, in this case, is not the true value.

When a CDR is running an open loop (i.e., when an error input (e.g., 0) occurs, no action is taken, which happens during a 1010 pattern), the memory of the Kf register 322 may cause various problems. The value in the Kf register 322 should be one constant value. However, due to noise and loop dynamics, the run time value may move around the constant value. When the loop stops updating under the 1010 pattern, the Kf register 322 may be stuck at a random value around the desired/ideal value, causing phase drift in one direction, resulting in the CDR losing the lock.

The CDR system shown in FIG. 3 (as well as in other embodiments disclosed herein) may be implemented in a variety of devices, including a display device. For example, the TX 302 may be implemented in s display device controller and a receiver with a CDR circuit in communication with the TX 302 may be connected a component of pixel drivers. The CDR circuit may be configured to extract a clock from data signals (e.g., pixel data) sent by the TX 302.

Figure 4:
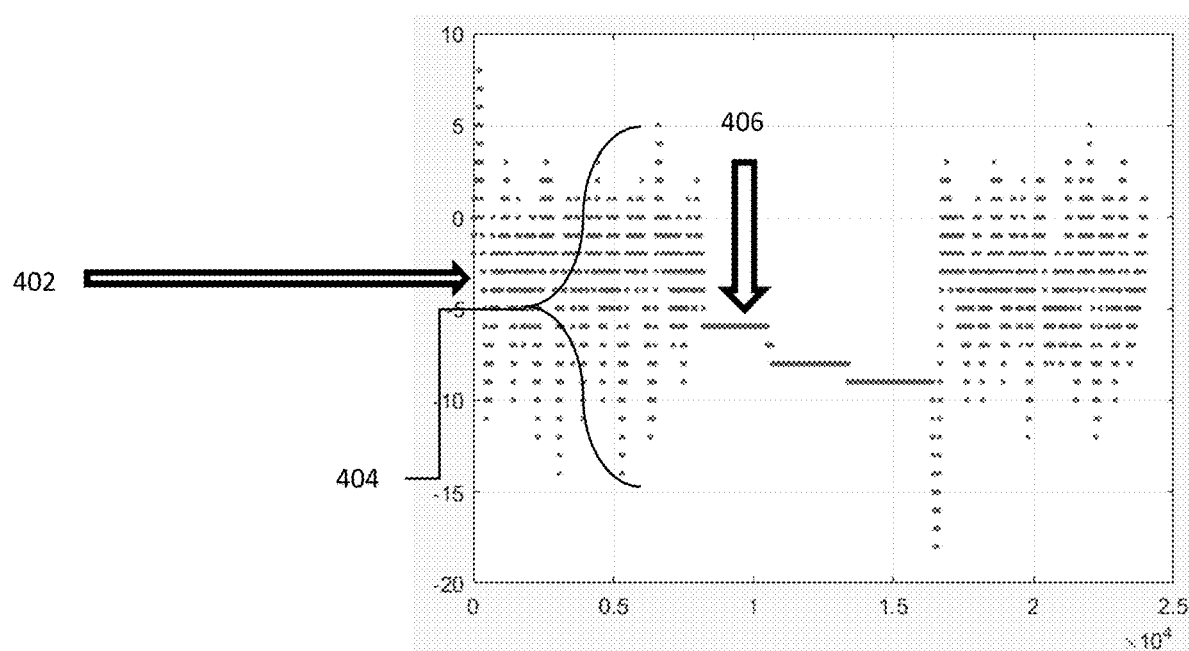
FIG. 4 is a graph showing output values of the CDR system, according to an embodiment.

FIG. 4 is a graph showing output values of a CDR system, according to an embodiment. True/ideal values 402 are shown to fluctuate. However, when a 1010 pattern enters the system, as shown in the output values 404, output values 406 are no longer fluctuating, the output of the Kf register may not be the true value, and the VCO may drift.

Figure 5A:
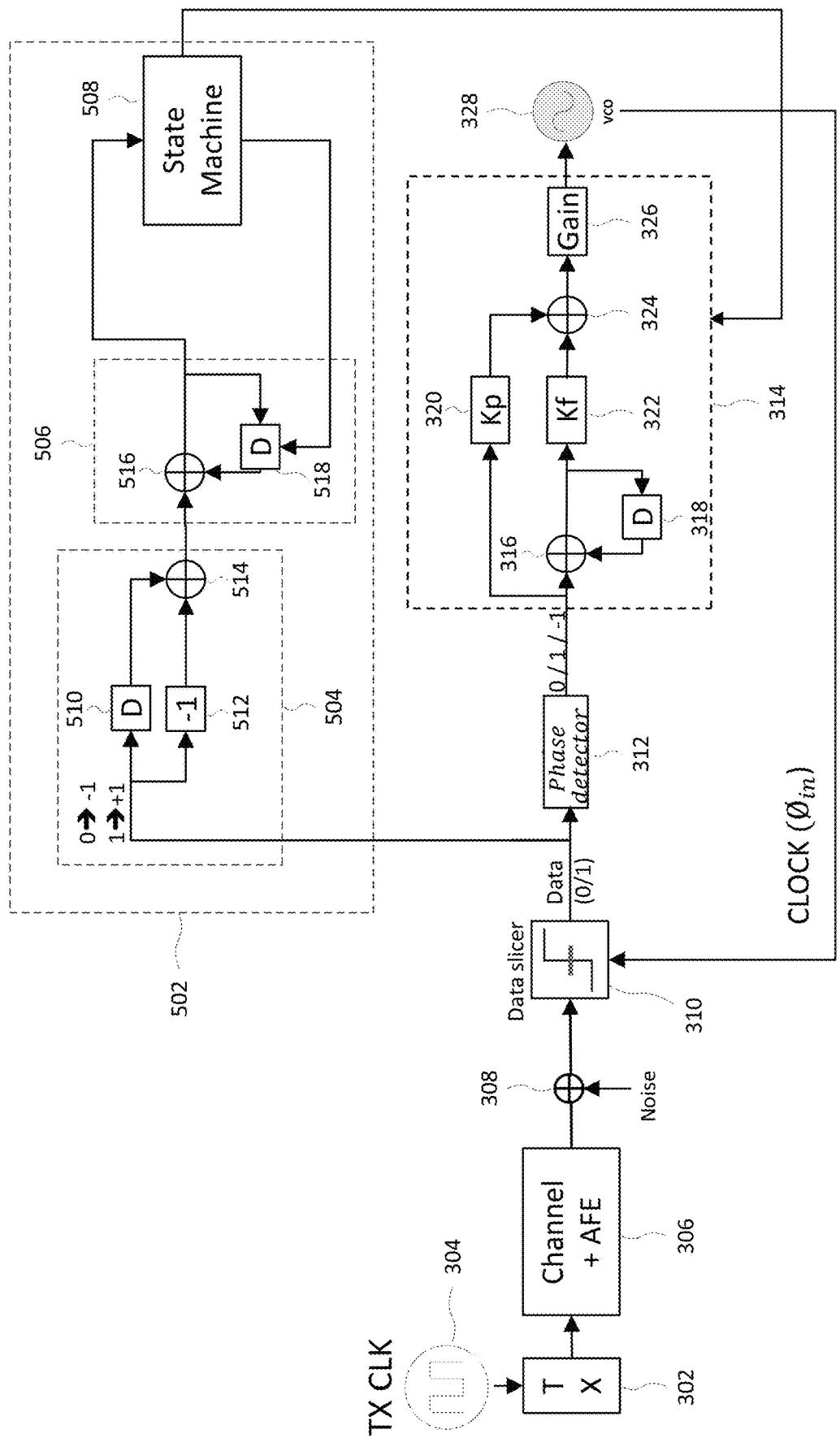
FIGS. 5A, 5B and 5C are diagrams of the CDR system, according to an embodiment.
Figure 5B:
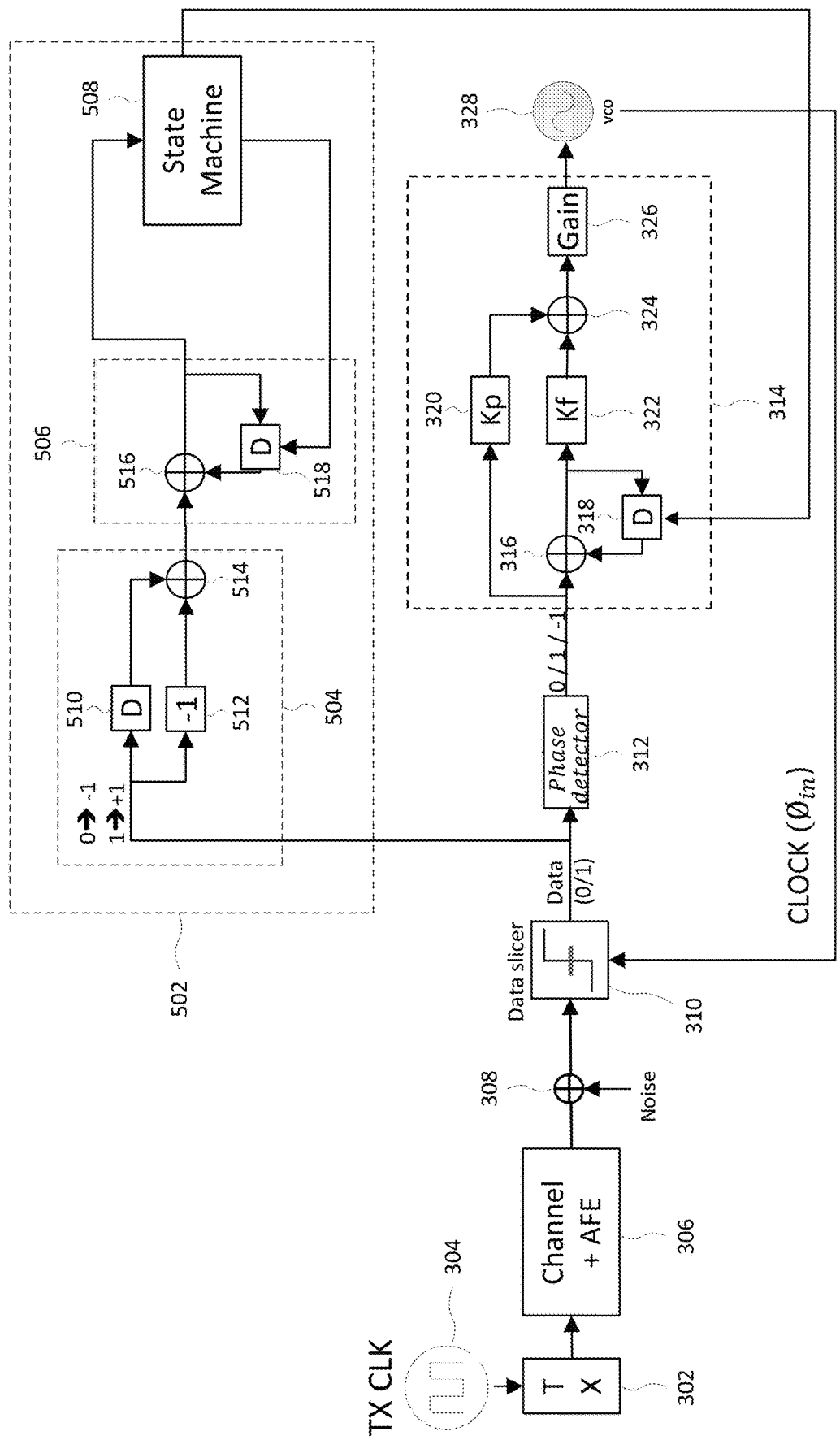
Figure 5C:
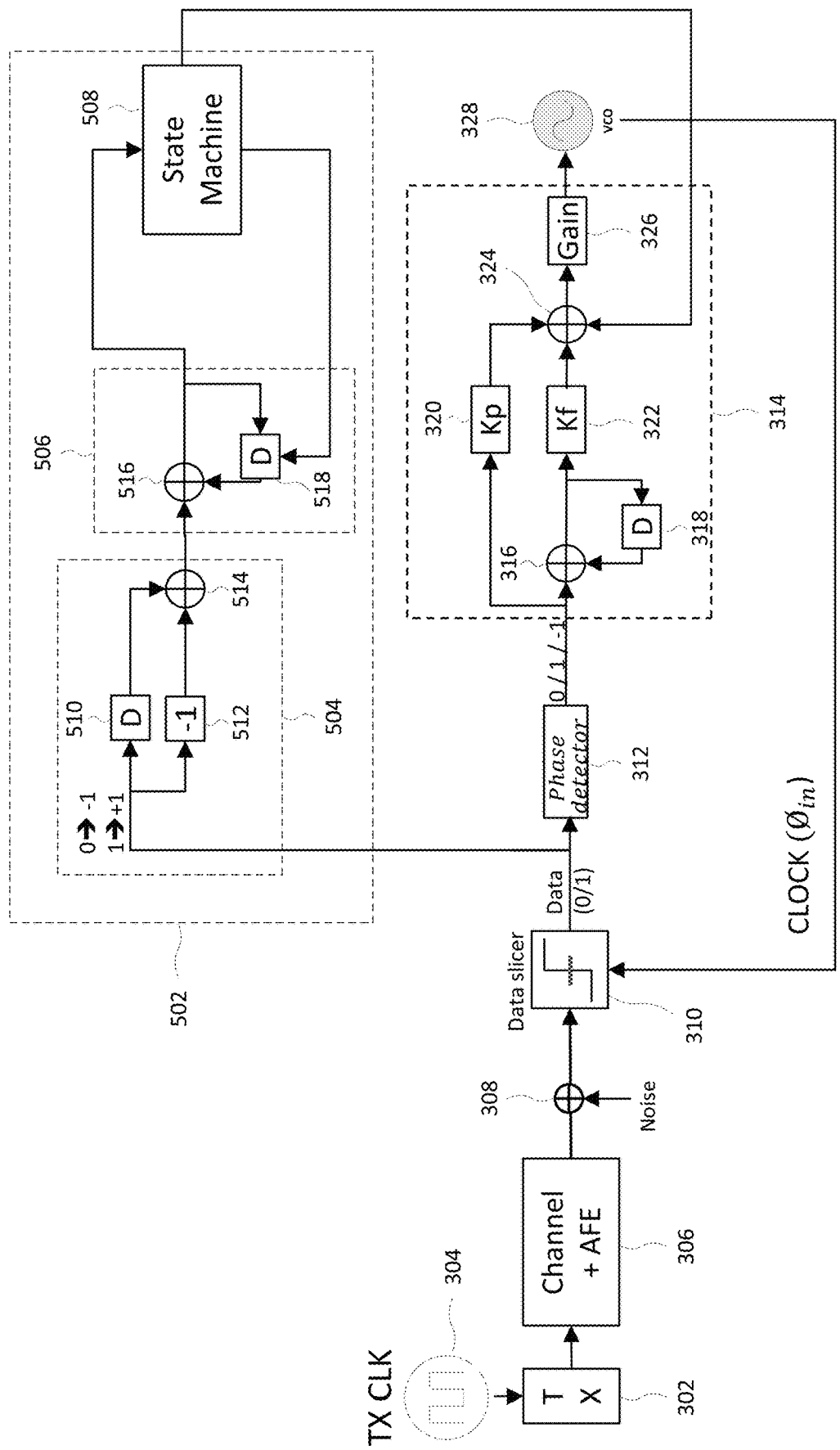

FIGS. 5A, 5B and 5C are diagrams of a CDR system, according to an embodiment. The CDR system of FIGS. 5A-5C may include components similar to those of the CDR system of FIG. 3 except that the CDR system of FIGS. 5A-5C further includes an additional 1010 pattern detection and correction block 502. Thus, duplicate descriptions may be omitted herebelow for brevity purposes.

The detection and correction block 502 may detect the output of the data slicer 310. The detection and correction block 502 may include a correlator (i.e., a correlator) 504, an accumulator 506, and a state machine 508. The correlator 504 may be a 1-tap correlator including a delay line 510, a logical inverter or NOT gate 512 (or some other component configured to multiply the input by −1), and an adder 514. The adder 514 may have a different bitwidth (e.g., smaller) than other adders in the CDR system. Some correlators may include a number of delay lines to detect a pattern being detected, as the specific pattern attempting to be detected may not be previously known or targeted. That is, in a correlator configured to detect an unknown pattern or multiple patterns, the number of components (e.g., the number of delay lines) is increased. However, according to embodiments, the single delay line 510 may be utilized to take advantage of the fact that the pattern attempting to be detected is a particular repeating pattern (i.e., 1010 pattern). The correlator 504 may be configured to receive data (e.g., data from data slicer 310), determine a first value of the received data, and output a second value corresponding to the received data. For example, the correlator 504 may be configured to output a value of 0 when a previous bit and a current bit are the same, and then output a different value when the previous bit and current bit are different (e.g., 1 or 2 depending on the bitwidth of the adder 514).

The accumulator 506 may include an adder 516 and a delay line 518 that stores a previous value output from the adder 516. The accumulator 506 may receive the output from the correlator 504, and generate an output that is received by the state machine 508.

The state machine 508 may determine whether a 1010 pattern is occurring by comparing the output of the accumulator 506 with a predetermined threshold value. For example, the state machine 508 may compare the output of the accumulator 506 at each cycle of a predetermined number of cycles (e.g., N cycles). Based on the state machine 508 determining that the output of the accumulator 506 exceeds (or is greater than or equal to) the predetermined threshold, the state machine 508 may set a flag value based on the determination (e.g., FLAG=1). Based on the state machine 508 determining that the output of the accumulator 506 does not exceed (or is less than or equal to) the predetermined threshold, the state machine 508 may set a flag value based on the determination (e.g., FLAG=0). The state machine 508 may also reset the delay line 518, for example, during each of a predetermined number of cycles.

As shown in FIG. 5A, The state machine 508 may output the flag value to the proportional-integral loop filter 314 as is described further below. As shown in FIG. 5B, the state machine 508 may output the flag value to the delay line 318. As shown in FIG. 5C, the state machine 508 may output the flag value to the added 324.

Figure 6:
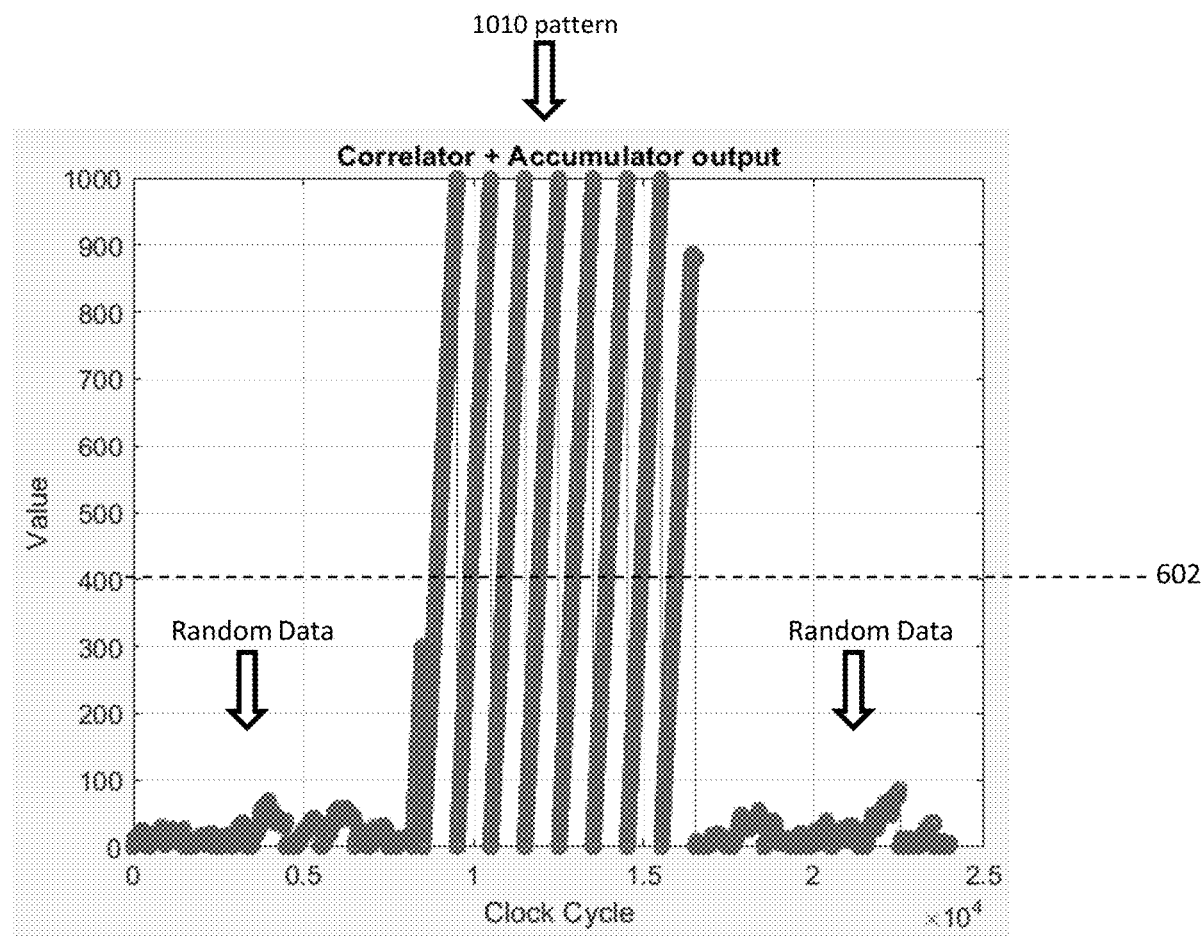
FIG. 6 is a graph showing detection of a 1010 pattern by a state machine, according to an embodiment.

FIG. 6 is a graph showing detection of a 1010 pattern by a state machine, according to an embodiment. In the example shown in FIG. 6, a clock cycle is shown against a value of an accumulator (e.g., accumulator 506), and a threshold value 602 is set as 400 (although it will be understood to those of skill in the art that other threshold values may be utilized).

As shown in FIG. 6, random data occurs before and after the 1010 pattern. The 1010 pattern causes the output value of accumulator to exceed the threshold value 602, such that the state machine (e.g., the state machine 508) may determine the occurrence of the 1010 pattern. Although FIG. 6 depicts an example where the threshold value 602 is exceeded eight times, the system may be configured to set a predetermined number of occurrences of exceeding the threshold value 602 before determining that a 1010 pattern has occurred. As the state machine may determine that the 1010 pattern has occurred, the state machine may set a flag value accordingly and output the flag value to a proportional-integral loop filter, as is described further below.

Figure 7:
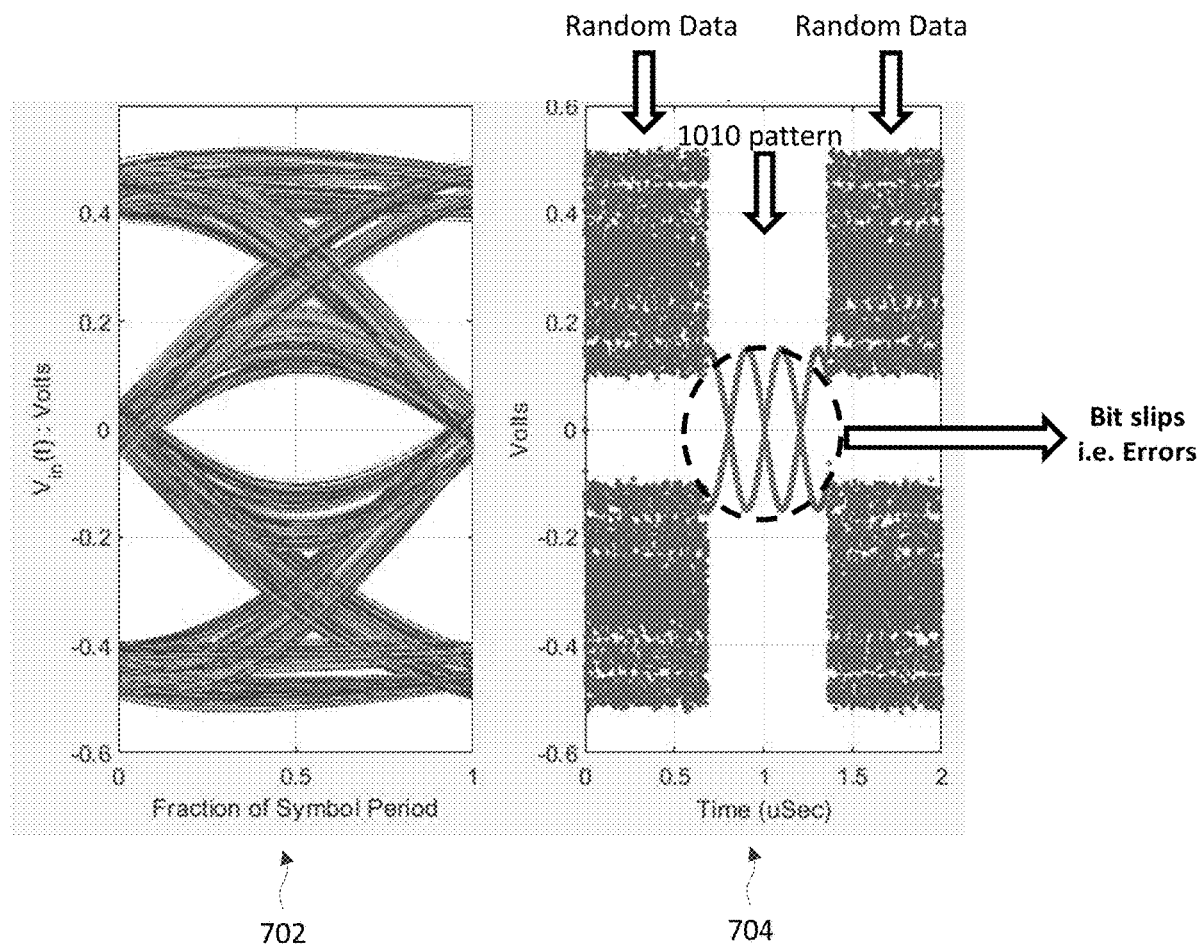
FIG. 7 is a diagram of CDR system data without detection and correction of a 1010 pattern, according to an embodiment.

FIG. 7 is a diagram of CDR system data without detection and correction of a 1010 pattern, according to an embodiment. Graph 702 shows a fraction of a symbol period versus an input voltage. As shown in graph 704, random data occurs before and after a 1010 pattern, and the 1010 pattern causes bit slip (e.g., errors).

Figure 8:
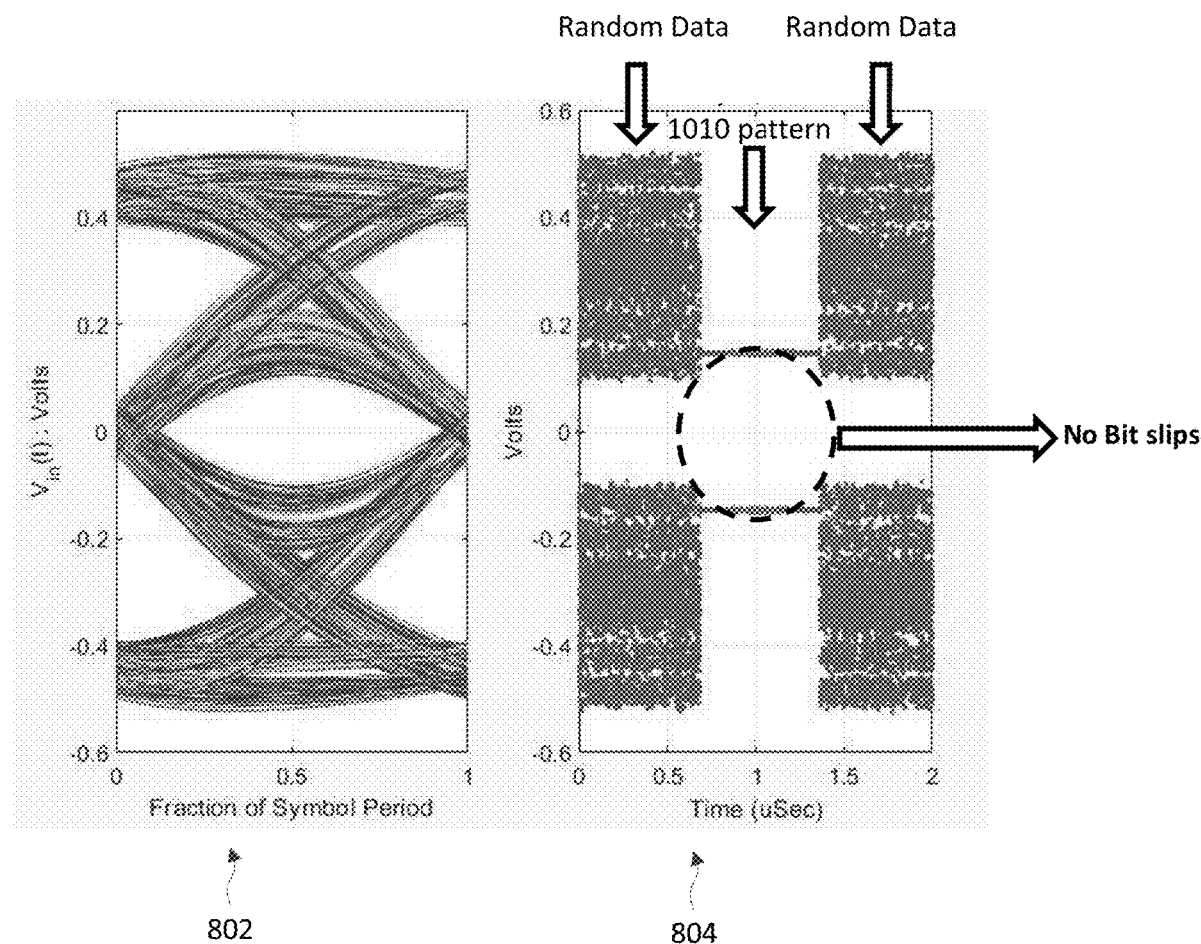
FIG. 8 is a diagram of CDR system data with detection and correction of a 1010 pattern, according to an embodiment.

FIG. 8 is a diagram of CDR system data with detection and correction of a 1010 pattern, according to an embodiment. Graph 802 shows a fraction of a symbol period versus an input voltage. As shown in graph 804, random data occurs before and after a 1010 pattern, but due to the correction, no bit slips (e.g., no errors) occur.

Figure 9A:
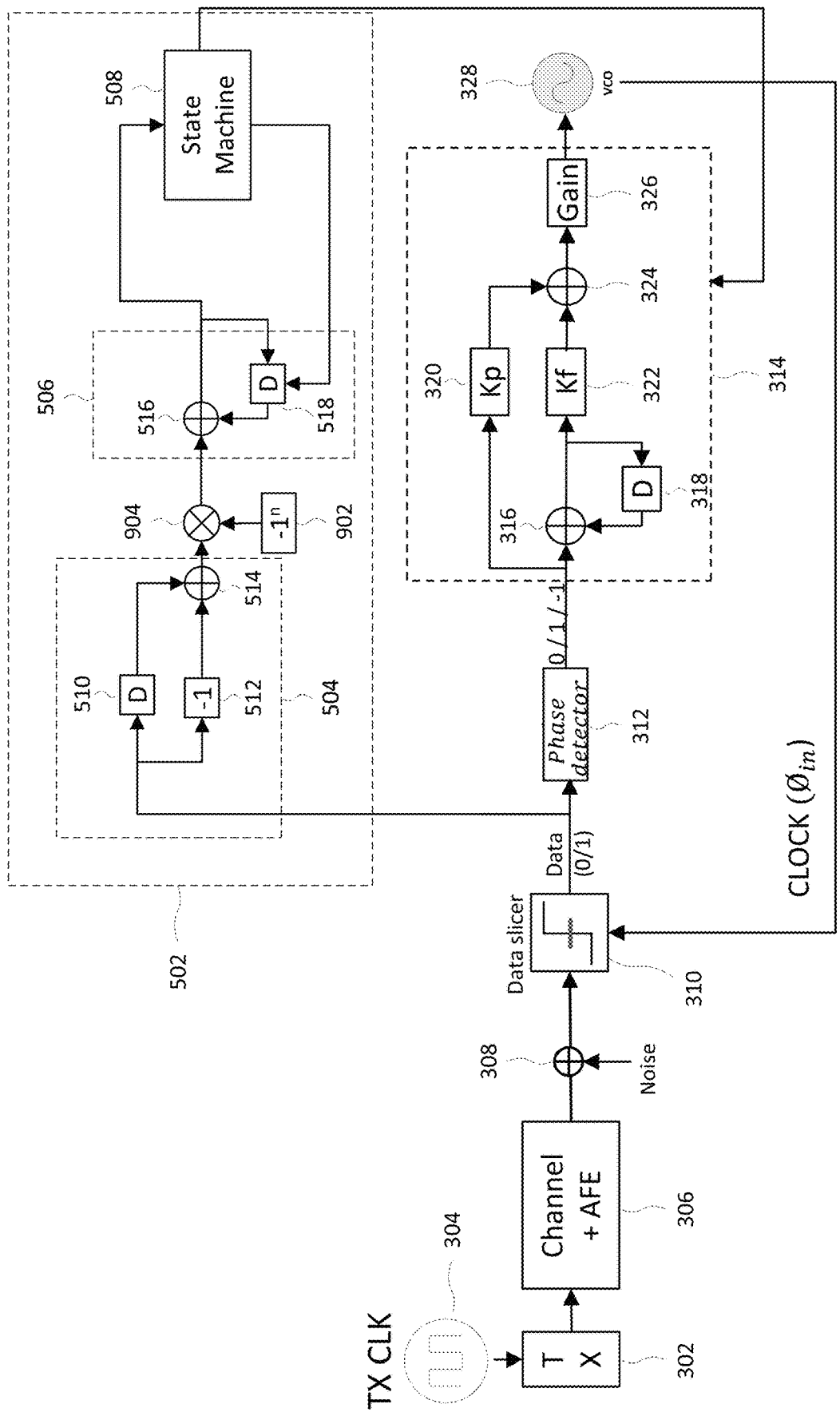
FIGS. 9A and 9B are diagrams of a CDR system, according to an embodiment.
Figure 9B:
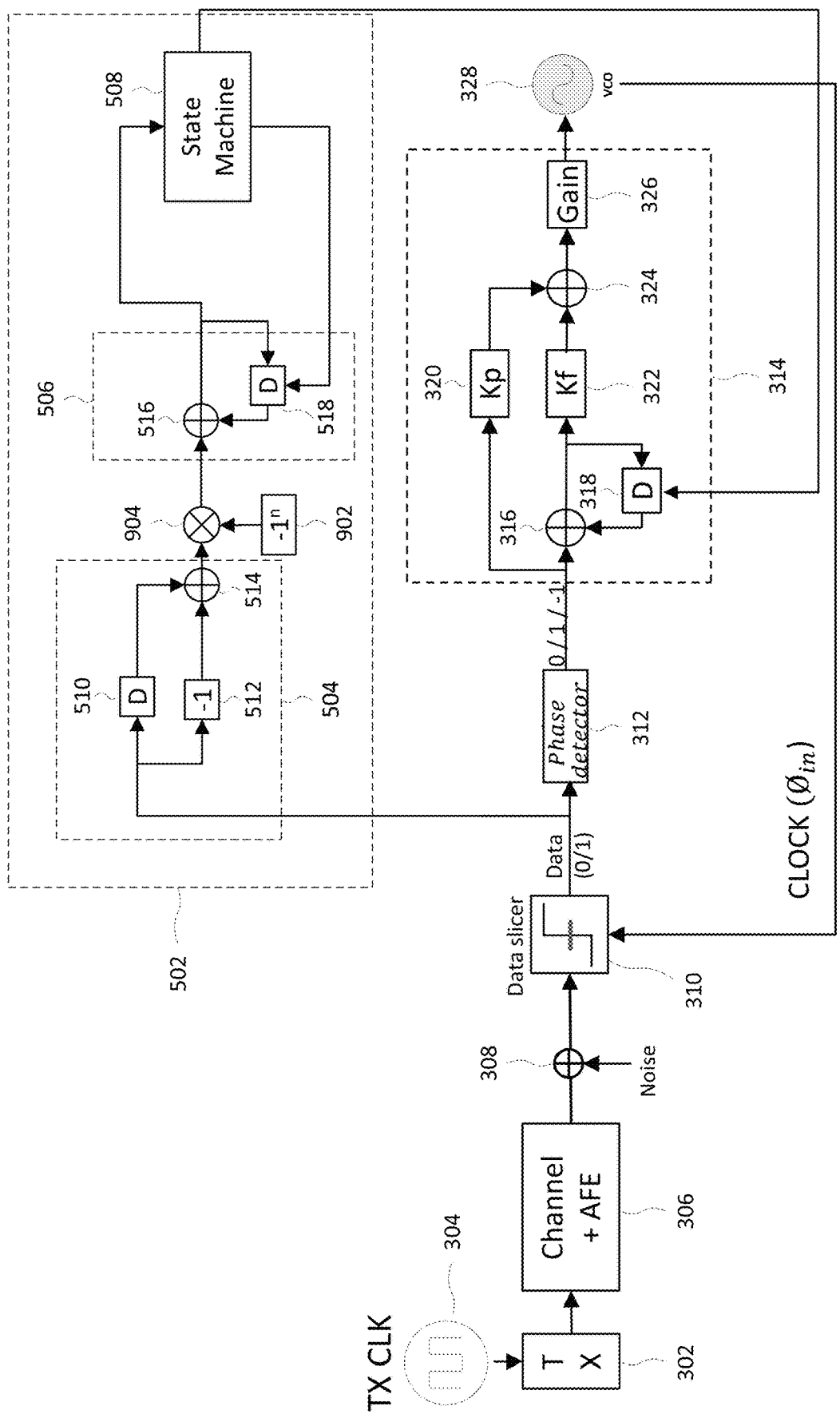

FIGS. 9A and 9B are diagrams of a CDR system, according to an embodiment. The CDR system of FIGS. 9A and 9B is similar to the CDR system of FIGS. 5A-5C. Thus, duplicate descriptions are omitted herein. However, the CDR system of FIGS. 9A and 9B may further include an integrator 902 and a multiplier 904. The output of the correlator 504 may be integrated to exploit the advantage of the repetition in the pattern without adding extra delay lines. That is, by knowing that the pattern sought to be detected is a repeating pattern of 1010 (i.e., the system does not want to detect other specific patterns), delay lines may be omitted that would ordinarily be implemented for general pattern detection.

As shown in FIG. 9A, the state machine 508 may output the flag value to the proportional-integral loop filter 314 and, in particular, as shown in FIG. 9B, to the delay line 318 (as well as other components in the proportional-integral loop filter 314 as will be understood by those of skill in the art from the disclosure herein).

Figure 10:
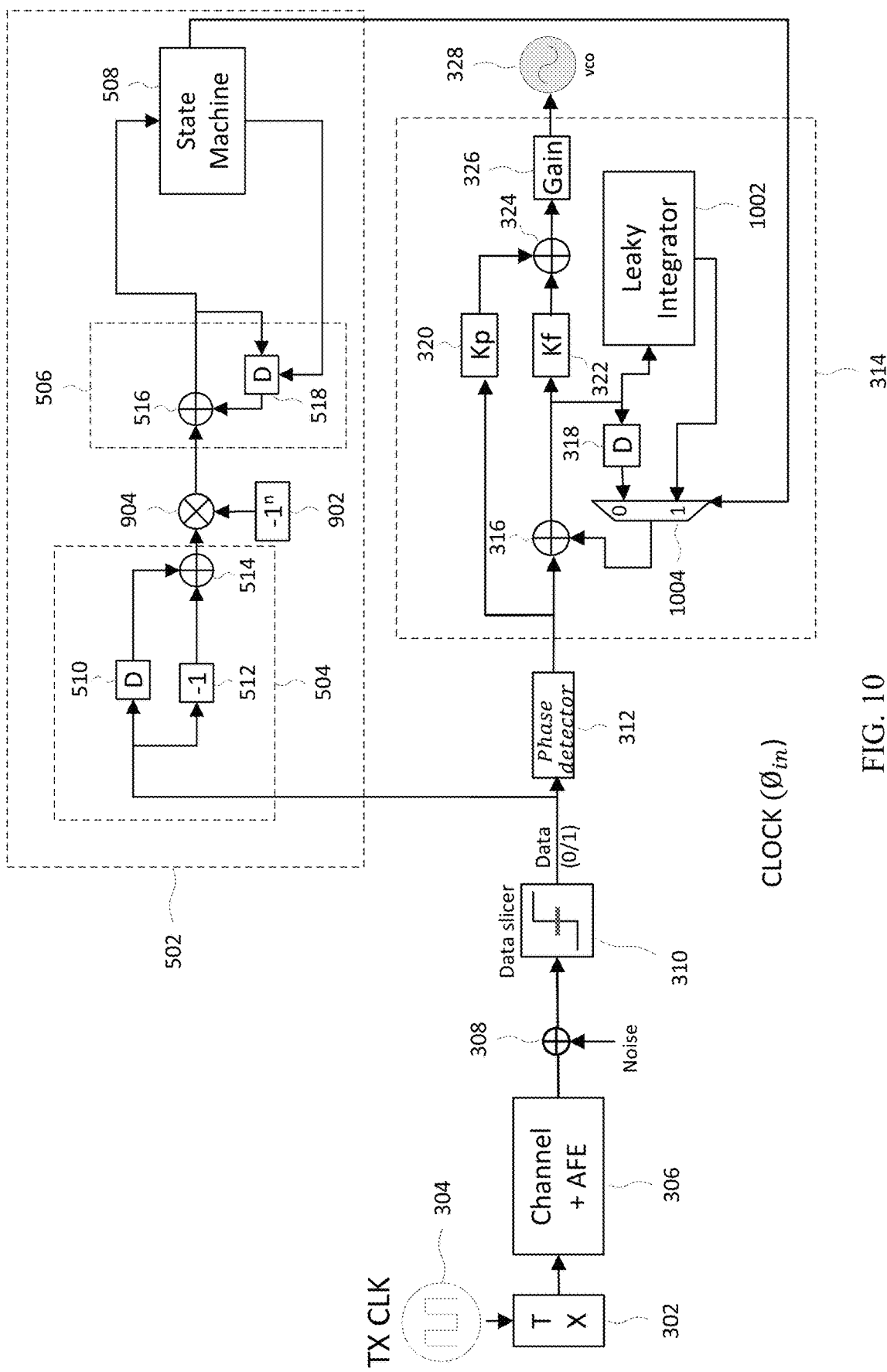
FIG. 10 is a diagram of a CDR system, according to an embodiment.

FIG. 10 is a diagram of a CDR system, according to an embodiment. The CDR system of FIG. 10 is similar to the CDR systems of FIGS. 5A-5B and 9A-9B. Thus, duplicate descriptions are omitted herein. However, the CDR system of FIG. 10, in the proportional-integral loop filter 314, may further include a leaky integrator 1002 and a multiplexer (MUX) 1004.

The leaky integrator 1002 may be configured to monitor or determine a running average of the Kf register 322 and output the running average to the MUX 1004. The output of the delay line 318 may also be sent to the MUX 1004. The aforementioned flag value generated by the state machine 508 may be sent to the MUX 1004. Based on the flag value being set to 0 (e.g., the state machine 508 determines that the value of the accumulator 506 does not exceed (or is at least equal to) the predetermined threshold value), the MUX 1004 may select the value of the delay line 318 to be output to the accumulator 316 (i.e., the CDR system continues to operate in a normal/regular mode). Based on the flag value being set to 1 (e.g., the state machine 508 determines that the value of the accumulator 506 does exceed (or is at least equal to) the predetermined threshold value), the MUX 1004 may select the value of the leaky integrator 1002 to be output to the accumulator 316. That is, the CDR system may determine the presence of a 1010 pattern, and that the Kf register 322 may be stuck, thereby resetting the system based on a previous value of the Kf register 322 that is determined from a running average determined by the leaky integrator 1002.

Figure 11:
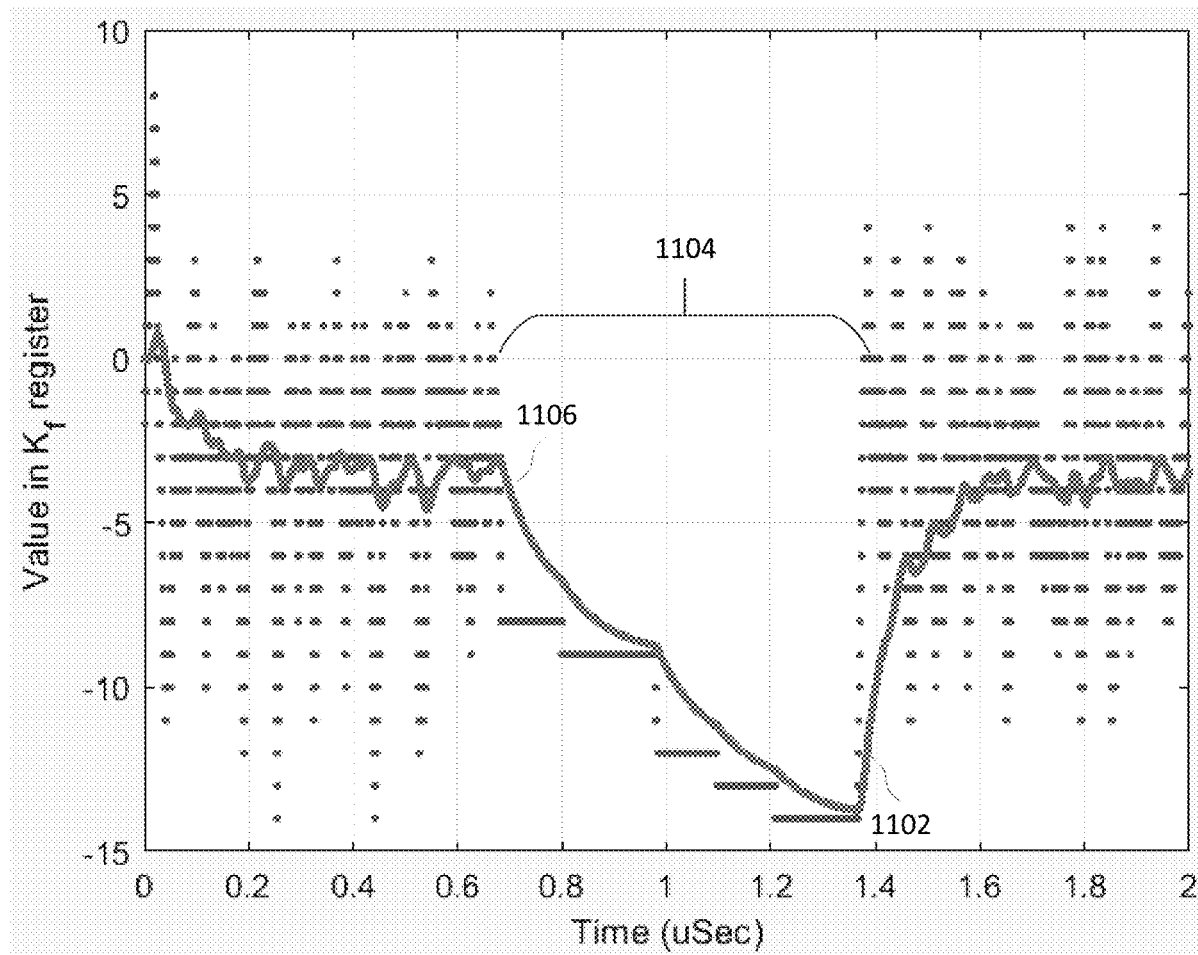
FIG. 11 is a graph showing leaky integrator data, according to an embodiment.

FIG. 11 is a graph showing leaky integrator data, according to an embodiment. The graph 1100 shows a value in a Kf register over time. The line 1102 indicates a running average value of the Kf register that is determined by the leaky integrator. As shown by section 1104, a 1010 pattern causes the running average value of the Kf register to decrease drastically. Thus, when the flag value indicates that the running average value of the Kf register should be used, the leaky integrator may be configured to output a value from a predetermined time point prior to a value decrease point 1106. An input of the leaky integrator may be X(n), and an output of the leaky integrator may be $Y(n)=\alpha Y(n-1)+(1-\alpha)X(n)$, where $\alpha=1-2^{-R}$, and R: 0, 1, . . . , 12.

Figure 12:
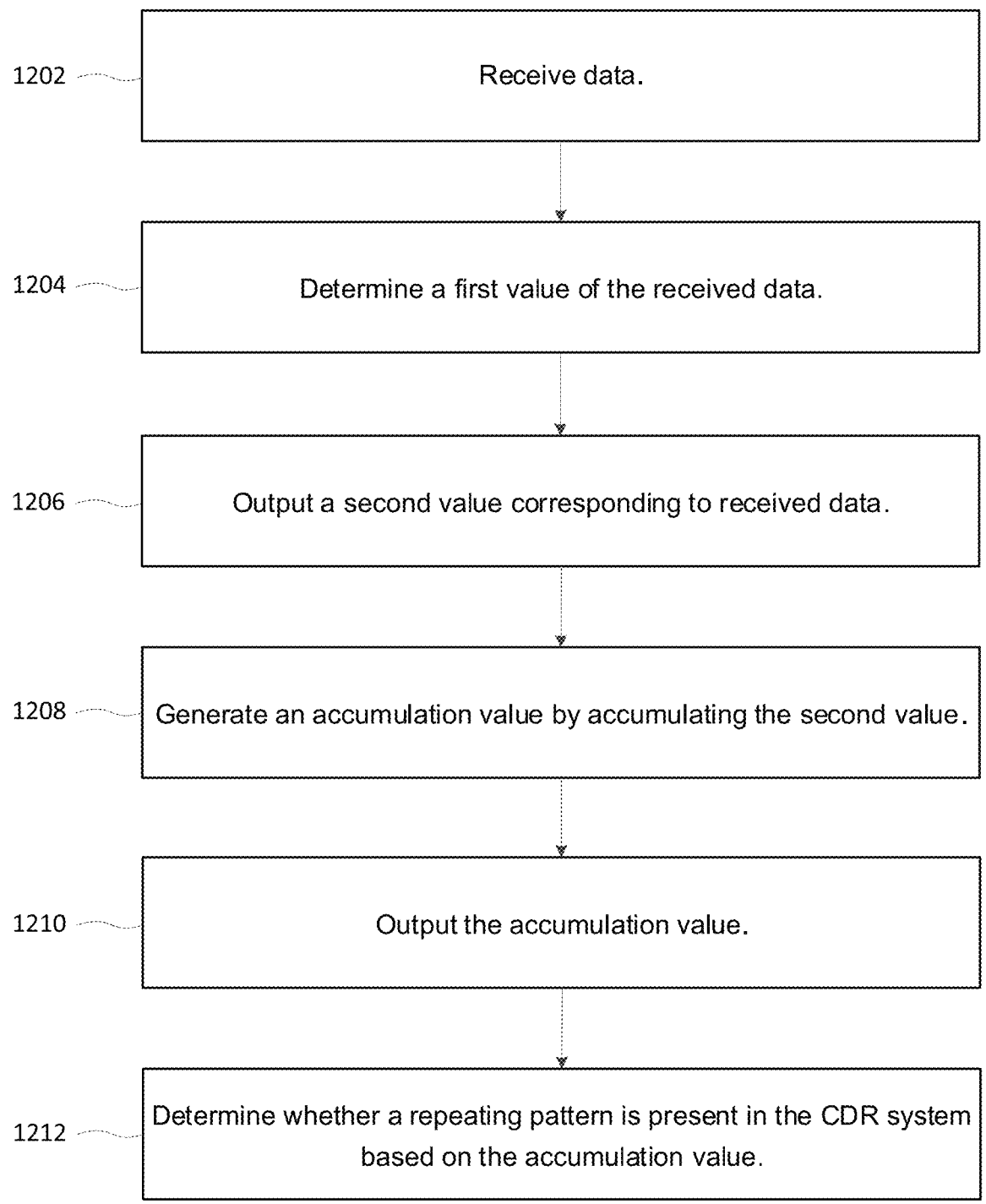
FIG. 12 is a flowchart of a method of a CDR system, according to an embodiment.

FIG. 12 is a flowchart of a method of a CDR system, according to an embodiment. In operation 1202, the CDR system may receive data. For example, the correlator 508 may receive data from an output of the data slicer 310. In operation 1204, the CDR system may determine a first value of the received data. For example, the correlator may determine the first value using delay line 510, the logical inverter/NOT gate 512 and the adder 512. In operation 1206, the CDR system may output a second value corresponding to the received data. For example, the correlator 508 may output the second value from the adder 514. In operation 1208, the system may generate an accumulation value by accumulating the second value. For example, the accumulator 506 may accumulate the second value with the adder 516. In operation 1210, the CDR system may output the accumulation value. For example, the accumulator 506 may output the accumulation value from the adder 518. In operation 1212, the system may determine whether a repeating pattern is present in the CDR system based on the accumulation value. For example, the state machine 508 may receive the accumulation value and determine whether a repeating pattern is present in the CDR system based on the accumulation value.

The foregoing disclosure provides illustration and description, but is not intended to be exhaustive or to limit the implementations to the precise form disclosed. Modifications and variations are possible in light of the above disclosure or may be acquired from practice of the implementations.

Some embodiments may relate to a system, a method, and/or a computer readable medium at any possible technical detail level of integration. The computer readable medium may include a computer-readable non-transitory storage medium (or media) having computer readable program instructions thereon for causing a processor to carry out operations.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program code/instructions for carrying out operations may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects or operations.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

At least one of the components, elements, modules or units (collectively "components" in this paragraph) represented by a block in the drawings including FIGS. 3, 5A, 5B, 5C, 9A, 9B and 10 may be embodied as various numbers of hardware, software and/or firmware structures that execute respective functions described above, according to an example embodiment. According to example embodiments, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like The flowchart and block diagrams in the drawings illustrate the architecture, functionality, and operation of possible implementations of systems, methods, and computer readable media according to various embodiments. In this regard, each block in the flowchart or block diagrams may represent a module, segment, or portion of instructions, which comprises one or more executable instructions for implementing the specified logical function(s). The method, computer system, and computer readable medium may include additional blocks, fewer blocks, different blocks, or differently arranged blocks than those depicted in the Figures. In some alternative implementations, the functions noted in the blocks may occur out of the order noted in the Figures. For example, two blocks shown in succession may, in fact, be executed concurrently or substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware may be designed to implement the systems and/or methods based on the description herein.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

The descriptions of the various aspects and embodiments have been presented for purposes of illustration, but are not intended to be exhaustive or limited to the embodiments disclosed. Even though combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A clock and data recovery (CDR) system, comprising:
a correlator configured to:
receive data;
determine a first value of the received data; and
output a second value corresponding to the received data;
an accumulator configured to:
generate an accumulation value by accumulating the second value output from the correlator; and
output the accumulation value;
a state machine configured to determine whether a repeating pattern is present in the CDR system based on the accumulation value; and
a loop filter configured to use one value from among a third value stored in a leaky integrator and a fourth value stored in a delay line, based on the determination by the state machine.

2. The CDR system of claim 1, wherein the state machine is further configured to determine whether the repeating pattern is present in the CDR system based on the accumulation value by comparing the accumulation value to a predetermined threshold value.

3. The CDR system of claim 2, wherein the state machine determines that a repeating pattern is not present based on the accumulation value being less than the predetermined threshold value.

4. The CDR system of claim 2, wherein the state machine determines that a repeating pattern is present based on the accumulation value being greater than the predetermined threshold value.

5. The CDR system of claim 1, wherein the loop filter comprises the delay line, the leaky integrator, and a register.

6. The CDR system of claim 5, wherein the leaky integrator is configured to generate a running average of values of the register.

7. The CDR system of claim 5, wherein the delay line is configured to store a previous value of the register.

8. The CDR system of claim 5, wherein the loop filter further comprises a multiplexer, and
wherein the state machine is further configured to, based on determining that the repeating pattern is present in the CDR system, send a flag value to the multiplexer causing the loop filter to use the third value stored in the leaky integrator.

9. The CDR system of claim 5, wherein the loop filter further comprises a multiplexer, and
wherein the state machine is further configured to, based on determining that the repeating pattern is not present in the CDR system, send a flag value to the multiplexer causing the loop filter to use the fourth value stored in the delay line.

10. The CDR system of claim 1, wherein the repeating pattern comprises a repeating 1010 pattern.

11. A method of a clock and data recovery (CDR) system, comprising:
receiving, by a correlator, data;
determining, by the correlator, a first value of the received data;
outputting, by the correlator, a second value corresponding to the received data;
generating, by an accumulator, an accumulation value by accumulating the second value output from the correlator;
outputting, by the accumulator, the accumulation value;
determining, by a state machine, whether a repeating pattern is present in the CDR system based on the accumulation value; and
using, by a loop filter, one value from among a third value stored in a leaky integrator and a fourth value stored in a delay line, based on the determining by the state machine.

12. The method of claim 11, wherein determining whether the repeating pattern is present in the CDR system comprises comparing the accumulation value to a predetermined threshold value.

13. The method of claim 12, wherein a repeating pattern is determined to not be present based on the accumulation value being less than the predetermined threshold value.

14. The method of claim 12, wherein a repeating pattern is determined to be present based on the accumulation value being greater than the predetermined threshold value.

15. The method of claim 11, further comprising generating, by the leaky integrator, a running average of values of a register.

16. The method of claim 11, further comprising storing, by the delay line, a previous value of a register.

17. The method of claim 11, further comprising, based on determining that the repeating pattern is present in the CDR system, sending a flag value to a multiplexer causing the loop filter to use the third value stored in the leaky integrator.

18. The method of claim 11, further comprising, based on determining that the repeating pattern is not present in the CDR system, sending a flag value to a multiplexer causing the loop filter to use the fourth value stored in the delay line.

19. The method of claim 11, wherein the repeating pattern comprises a repeating 1010 pattern.

20. An electronic device, comprising:
a correlator that is configured to receive data, determine a first value of the received data, and outputs a second value corresponding to the received data;

an accumulator that is configured to generate an accumulation value by accumulating the second value output from the correlator, and output the accumulation value;
a state machine that is configured to determine whether a repeating pattern is present based on the accumulation value; and
a loop filter that is configured to use one value from among a third value stored in a leaky integrator and a fourth value stored in a delay line, based on the determination by the state machine.

* * * * *